United States Patent
Cho et al.

(10) Patent No.: US 6,762,126 B2
(45) Date of Patent: Jul. 13, 2004

(54) METHOD OF FORMING AN INTERLAYER DIELECTRIC FILM

(75) Inventors: Young-Joo Cho, Gyeonggi-do (KR); Eun-Kee Hong, Gyeonggi-do (KR); Ju-Bum Lee, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 158 days.

(21) Appl. No.: 10/082,019

(22) Filed: Feb. 20, 2002

(65) Prior Publication Data

US 2002/0160614 A1 Oct. 31, 2002

(30) Foreign Application Priority Data

Feb. 22, 2001 (KR) .......................................... 2001-8859

(51) Int. Cl.$^7$ ............................................. H01L 21/311
(52) U.S. Cl. ...................................... 438/694; 438/758
(58) Field of Search ................................ 438/694, 758, 438/787, 789, 790

(56) References Cited

U.S. PATENT DOCUMENTS

| | | | |
|---|---|---|---|
| 4,937,304 A | 6/1990 | Ayama et al. | |
| 4,947,340 A | 8/1990 | Marchant et al. | |
| 4,950,481 A | 8/1990 | Keri et al. | |
| 5,310,720 A | 5/1994 | Shin et al. | |
| 5,494,978 A | 2/1996 | Shimizu et al. | |
| 5,905,130 A | 5/1999 | Nakahara et al. | |
| 5,976,618 A | 11/1999 | Fukuyama et al. | |
| 6,489,252 B2 * | 12/2002 | Goo et al. | |

FOREIGN PATENT DOCUMENTS

JP    11-145286    5/1999

OTHER PUBLICATIONS

English Abstracts of Japanese Patent No. 11–145286.

* cited by examiner

Primary Examiner—Phuc T. Dang
(74) Attorney, Agent, or Firm—Marger Johnson & McCollom

(57) ABSTRACT

In a method for forming an interlayer dielectric film, an insulating film is deposited on a semiconductor substrate that has a metal wiring pattern. The insulating film is polished by CMP until exposing an upper portion of the wiring pattern. A spin on glass composition, which includes polysilazane, is coated over the polished insulating material and exposed portions of the wiring pattern to form a film. The film is then pre-baked in a temperature range of 50 to 350° C., and then hard-baked in a temperature range of 300 to 500° C. After the hard-baking, the film is then heat-treated in an oxidation atmosphere. With the hard-baking, gasses of the coating of film may be removed so that the amount of gas generated during a subsequent anneal or heat-treating process may be reduced. Accordingly, particle contaminants may be reduced by such process in addition to providing a means for reduced risk of crack formation.

36 Claims, 8 Drawing Sheets

METHOD OF FORMING AN INTERLAYER DIELECTRIC FILM

This application claims benefit and priority of Korean Patent Application No. 2001-8859, filed on Feb. 22, 2001, under 35 U.S.C. §119, the entirety of which is hereby incorporated by reference.

BACKGROUND OF THE INVENTION

The present invention relates to a method for forming an interlayer dielectric film, and more particularly, to a method for coating a wiring pattern using an SOG (spin on glass) solution.

Recently, great strides are being made in the semiconductor technology for information media, and computers. Often, it is desirable for a semiconductor device to operate with high speed and to provide memory of large storing capacities. Accordingly, semiconductor device manufacturers strive to improve levels of integration, reliability and response speed.

Exemplary integrated circuits may include a plurality of active devices that are isolated on a semiconductor substrate. The active devices are typically isolated from each other during the early stages of a semiconductor manufacturing process. Later in the process, the devices may be electrically interconnected to form circuits. Multilevel interconnection structures may serve to interconnect the plurality of devices.

When forming such multilevel interconnection structures, it may become more difficult to keep a smooth topography for a top layer of the interconnection structure as its number of layers increases. For example, when forming a semiconductor wafer with two metal layers, a first interlayer dielectric film may be deposited over the semiconductor wafer. Note, it will be understood that semiconductor substrate may comprise a partially processed device which may include previously fabricated transistors and other electrical circuit elements. Next, vias may be formed in the first dielectrical layer and a second metal layer deposited thereover and coupled to the substrate through the dielectric. If the surface of substrate is uneven, then the surface of the dielectric layer may also be uneven. Accordingly, when forming the second metal layer on the surface of the dielectric, such second metal wiring layer may suffer breaks or fractures resulting from the protrusions or cracks of the lower layer. In other words, because of the uneven surface of the dielectric, the second metal may end up being formed non-uniformly over the dielectric, which in turn may adversely affect a yield of the semiconductor device. To prevent such difficulties, the dielectric may be planarized before forming the vias or second metal wiring layer.

Exemplary planarizations include use of a BPSG (borophosphorous silicate glass) or SOG (spin-on-glass) of superior reflow characteristics, or use of CMP (chemical mechanical polishing) processing of such dielectrics.

BPSG is a common type of dielectric for filling gaps between metal lines. However, the quality of BPSG deposition can depend greatly upon the type and quality of equipment, processes and processing chamber. In addition, the materials and gases for these processes can be very expensive, toxic and hazardous.

Furthermore, as device geometrics drop with increased levels of integration, line spacings similarly decrease. If a bridge defect is formed between conductive lines, it may simply be buried by, e.g., BPSG of an interlayer dielectric film. Thus, the bridges may result in the formation of voids that may hinder etch stop capabilities and in general effect semiconductor-manufacturing yield. Accordingly, there appears to be a need for a processor that may be able to avoid some of the above problems.

Referencing FIG. 1, when dielectric 14 is coated on wiring pattern 12 on semiconductor substrate 10, the surface of dielectric 14 may be uneven. The uneven surface may result from a step or difference in elevation of the upper surface of the substrate relative to the upper surface of lines 12. To remove the surface protrusions of dielectric 14, an etch back or CMP process may planarize the surface of dielectric 14.

As shown in FIG. 2, a portion of dielectric 14 is planarized until obtaining a flat surface. Note, wiring pattern 12 is not exposed. For such "partial" CMP process, the density of the metal wring pattern 12 may still affect the degree of planarity and the amount of material that may need to be removed by the CMP process. For example, a dishing effect (a phenomenon that a dish-shaped recess is formed on the polished surface) may occur. To improve the dielectric planarity and reduce the dishing effect, a "full" CMP process, referencing FIG. 3, may be performed to polish the dielectric until exposing upper portions of the metal wiring pattern 12. Accordingly, a separate insulating film e.g., such as an oxide, may be formed to insulate and cover the exposed metal.

As used hereinafter, metal wiring pattern may be referenced alternatively as wiring pattern, metal lines, or simply lines.

For the full CMP process, micro scratches may result. Depending on the kinds of slurries used in the CMP process, undesirable residue may collect in the micro scratches and adversely affect following processes. Some of the adverse effects might even result in a failure of the semiconductor device.

Furthermore, after completing a full CMP process, a surface step may result between an upper surface of lines 12 relative to that of dielectric 14 between the lines. The full CMP process creates the step since the interlayer dielectric film 14 that resides between the lines may be over-polished. As shown in FIG. 4, the step, or difference in elevations, may be attributed to a slight over-polishing of dielectric 14. Again, the step may exert a bad influence upon the capping oxide 16, in which an unevenness of the surface can affect the planarity of the surface of capping oxide 16.

In another technique, dielectric film may be formed from a spin-on-glass or SOG process and planarization may be obtained through a coating process. For example, U.S. Pat. No. 5,310,720, issued to Shin et, al, discloses a method for converting a polysilazane layer to silicon oxide by firing the polysilazane in an oxygen atmosphere.

A polysilazane based SOG has Si—N, Si—H and N—H bonds. The N—H bonds are replaced with Si—O bonds when baked in an atmosphere including oxygen and water. Because the method for forming the silicon oxide film using the SOG may be carried out by a simple spin coat and cure process, the method allows reduced manufacturing costs. However, the Si—N bonds may not always be replaced with the Si—O bonds (refer to Japanese Laid-Open Patent Publication No. 11-145286). With residual S-N bonds, the resultant film may have insulating and other electrical features that differ from those of conventional silicon oxide films, such as, e.g., BPSG or TEOS films. In some instances the resultant film with the residual S-N bonds may cause subsequent problems.

U.S. Pat. No. 5,976,618, issued to Shunichi Fukuyama et, al, discloses a method for converting an inorganic SOG film to silicon oxide a through two-step heat treatment processes. Formed by a spin-coating method and of this particular example, the thickness of the silicon oxide film may be insufficient to cover conductive patterns, e.g., such as a gate electrode or a metal line.

With regards to the SOG composition with polysilazane, a pre-baking process may be carried out for a few minutes below 500° C. Then, an annealing process may be provided for tens of minutes at temperatures above 500° C. and in an oxidation atmosphere so as to convert the polysilazane to silicon oxide. But when the SOG film is subject to the anneal, $SiH_4$ may be released from the film, which in turn may react with an oxidation gas to form $SiO_2$ contaminates within the process chamber of the anneal. Some of these particles may have a size greater than 10 nm and may cause damage to the wafer that is being annealed within the process chamber.

The oxide obtained at a periphery may be thick. If it exceeds a given thickness, e.g., MCFT (maximum crack free thickness) such as 15,000 A then the oxide may be vulnerable to cracking after the annealing.

SUMMARY OF THE INVENTION

Exemplary embodiments of the present invention may provide for methods of forming an interlayer insulating film capable of preventing cracks and methods that may use SOG compositions with polysilazane for the formation of, e.g., a capping oxide.

In accordance with exemplary embodiments of the present invention, an insulating material is formed on a semiconductor substrate. The insulating material may be polished using a chemical mechanical polishing process and an upper portion of a metal wiring pattern of the substrate is exposed. Spin-on-glass composition that includes polysilazane may be coated over the polished material to form a film. The film is pre-baked in a temperature range of about 50 to 350° C., and, thereafter, hard-baked in a temperature range of about 300 to 500° C. The film may then be heat-treated in an oxidation atmosphere.

By hard-baking the film using a temperature range of about 300 to 500° C., an amount of gas that might otherwise be generated from the film during the heat-treating may be reduced. Likewise, contaminants might similarly be reduced.

According to other exemplary embodiments of the present invention, a thickness of the film is compared to a maximum crack free thickness. Further polishing or an etch back may then be performed to decrease the thickness to less than the maximum crack free thickness.

In addition, if the thickness of the film is over the maximum crack free thickness, the chemical mechanical polishing or the etch back process may continue until reducing the thickness of the film to below the maximum crack free thickness.

In accordance with further exemplary embodiments, the coating uses an SOG composition that comprises 3 to 15 weight percent of perhydropolysilazane and 97 to 85 weight percent of a solvent. The perhydropolysilazane may have a structure of —$(SiH_2NH)_n$ (wherein, n is a positive number), an average molecular weight of about 4000 to 8000 and a molecular weight dispersion degree of about 3.0 to 4.0.

BRIEF DESCRIPTION OF THE DRAWINGS

Exemplary embodiments of the present invention are described below with reference to the accompanying drawings in which.

DETAILED DESCRIPTION OF THE PREFERRED EMBODIMENTS

Figure 1:
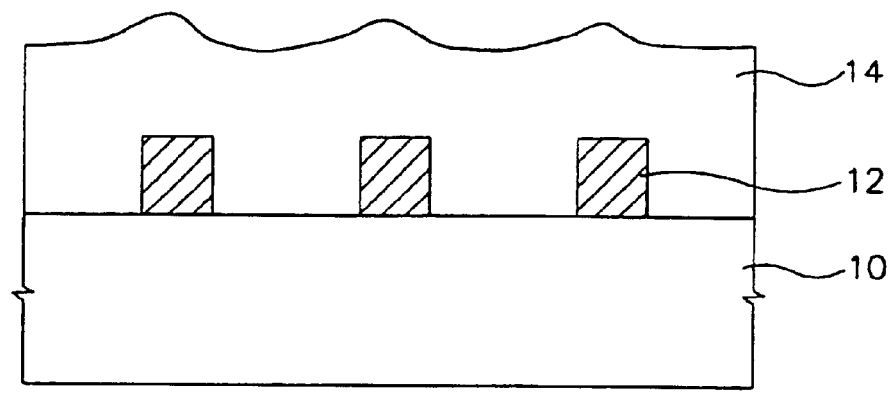
FIG. 1 is a simplified cross-sectional view showing a bumpy surface of an interlayer dielectric film formed over a pattern on a substrate.
Figure 2:
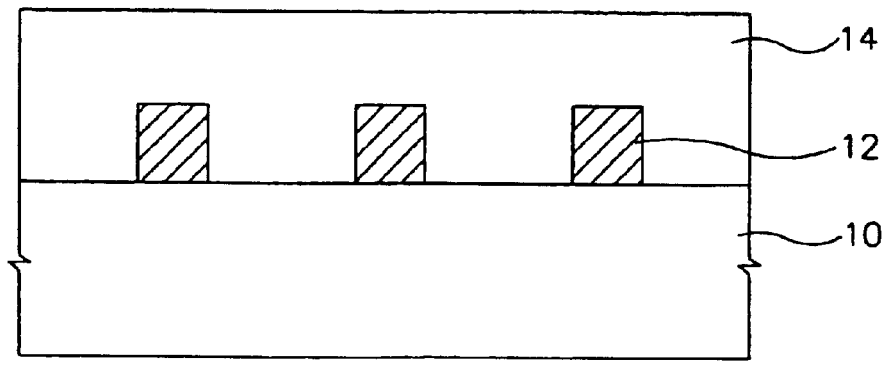
FIG. 2 is a simplified cross-sectional view showing a surface of an interlayer dielectric film which has been planarized.
Figure 3:
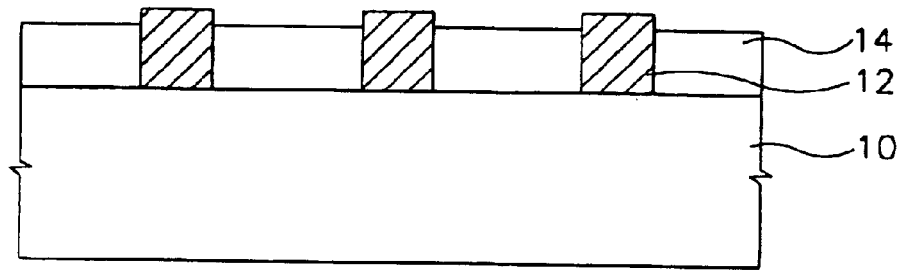
FIG. 3 is a simplified cross-sectional view showing an exemplary intermediate stage of processing a semiconductor substrate, in which an upper portion of a pattern may be exposed by a planarization of a dielectric film.
Figure 4:
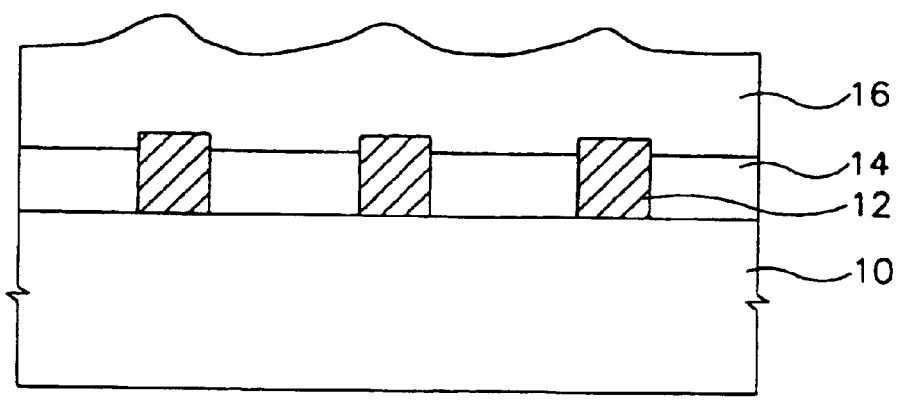
FIG. 4 is a cross-sectional view showing another exemplary stage of processing a semiconductor substrate, in which a layer may be coated over the exposed pattern of FIG. 3.

In the following description, exemplary embodiments of the present invention may be described with reference to accompanying drawings of simplistic illustrations. Certain elements of the drawings that are well understood or implied may be shown in block diagram form or may be omitted altogether, in order to avoid obscuring an understanding of the present invention. Additionally, certain features may not be drawn to scale.

A spin on glass composition for coating films, in accordance with exemplary embodiments of the present invention, may comprise a perhydropolysilazane having a structure of —$(SiH_2NH)_n$ (wherein, n is a positive number). In addition, the perhydropolysilazane may have an average molecular weight of about 4000 to 8000 and a molecular weight dispersion degree of about 3.0 to 4.0.

Various methods may be used for manufacturing polysilazane. One exemplary method may obtain a complex compound by reacting halo-silane with a Lewis base. The compound may then be reacted with ammonia.

In another exemplary method, polysilazane may be prepared by reacting silicon halide, such as $SiCl_4$ or $SiH_2Cl_2$, with amine. Known methods are available for converting silazane into the polysilazane, e.g., by using an alkali metal halide compound, and likewise for dehydrogenating a silane compound with an amine compound using a complex compound of a transition metal.

U.S. Pat. No. 5,494,978, issued to Yasuo Shimize et, al, discloses preparing a modified polysilazane from an inorganic polysilazane of an average molecular weight of about 100 to 100000.

In addition, U.S. Pat. No. 5,905,130, issued to Hirohiko Nakahara, discloses a method for preparing polysilazane by reacting a polyaminosilane compound with a polyhydrogenated nitrogen-containing compound under a basic catalyst, or by reacting a polyhydrogenated silicon compound with the polyhydrogenated nitrogen-containing compound under a basic solid oxide catalyst.

U.S. Pat. No. 4,947,340, issued to Yasuo Shimizu et, al, discloses a method for manufacturing perhydropolysilazane having an average molecular weight of 1,120. In addition, U.S. Pat. No. 4,937,304, issued to Ayama et, al, and U.S. Pat. No. 4,950,481, issued to Takeuchi et, al, disclose methods for manufacturing polysilazane with given molecular weights.

There is no particular limitation upon how the polysilazane is prepared for the present invention. The polysilazane may be obtained by one of the above-described methods, or other effective methods, so long as the perhydropolysilazane is fractionated to establish the desired molecular weights of about 4000 to 8000 and with a dispersion degree of about 3.0 to 4.0.

If the average molecular weight of the polysilazane is less than about 4000, not only may the outgassing increase, but also the polysilazane may convert more rapidly into silicon oxide, wherein cracks may be generated. Near the other end of the scale, if the average molecular weight of the polysilazane exceeds about 8,000, the viscosity of the SOG composition may increase so much that it may be difficult to use the composition for obtaining an even and uniform coating. Therefore, in accordance with exemplary embodiments of the present invention, the average molecular weight of the perhydropolysilazane is established in a range of about 4000 to 8000, and more preferably, in a range of about 4500 to 7000.

In addition, a molecular weight dispersion degree may be established. The molecular weight dispersion degree characterizes the relative number of molecules within the composition of particular weights relative to the molecules of the average molecular weight. If it is less than 3.0, the polysilazane may not be effectively fractionated, which might then adversely affect the film's yield. If the molecular weight dispersion degree exceeds about 4.0, the material may not be able to be fully or uniformly converted to silicon oxide. In this embodiment, the molecular weight dispersion degree of the polysilazane may be in the range of about 3.0 to 4.0.

To further prepare the SOG composition, the polysilazane may be dissolved in an organic solvent. Although other organic solvents may be used; in this exemplary embodiment, an aromatic solvent may be used, such as xylene or an ether such as dibutylether.

In accordance with a further embodiment, the SOG composition with polysilazane may be further prepared so as to enable a contact angle of less than about 4 degrees with respect to an underlayer, e.g., such as a silicon nitride film. If the contact angle should be larger than about 4 degrees, an adhesion force of the material with respect to the underlayer might be compromised.

In accordance with further aspects of an exemplary embodiment, the SOG composition may comprise a viscosity of about 1 to 10 mPa.s, and, more typically, about 1 to 8 mPa.s. In further exemplary embodiments, the SOG composition may be prepared with viscosity of 1 to 10 mPa.s and shear rate of 54 to 420 (1/s).

For certain exemplary embodiments, the SOG composition may include an impurity compound that may comprise at least one element selected from the group consisting of B, F, P, B, C and O. Among such impurities, if at least one of B, F, P, and B is used in the SOG composition, the silicon oxide film obtained from the SOG composition may contain impurities to impart upon the silicon oxide film features of a BPSG film or PSG film. In addition, if the impurities C or O are used in the SOG composition, the SOG composition may be more easily converted into the silicon oxide film. By using such SOG compositions as herein described, the compositions may be capable of complete conversion into silicon oxide through curing, and, at the same time, provide the ability to form the silicon oxide film with a planar surface. In exemplary embodiments of the present invention, the curing may be divided into a pre-baking portion and a hard-baking portion.

Pre-baking may be carried out at temperatures in a range of about 50 to 350° C. The pre-baking may also include a sequence of multiple levels, which multi-level stages may transition to further levels of the sequence at about every 2 or 3 minutes.

The hard-baking may use temperatures in a range higher than the temperatures of the pre-baking and may last for a longer duration. For example, the hard-baking, in accordance with an exemplary embodiment, may use temperatures in a range of about 300 to 500° C. and last a duration of about 10 to 120 minutes. In accordance with this exemplary embodiment, the hard-baking may use an oxidation atmosphere such as an oxygen atmosphere, a vapor atmosphere or a mixed atmosphere of both vapor and oxygen. In an alternative exemplary embodiment, the atmosphere may comprise an inert atmosphere, e.g., such as a nitrogen atmosphere on a vacuum. The hard-baking is to accelerate outgassing of $SiH_4$, so that such gas is not as prevalent during a subsequent anneal.

Again, the hard-baking may use temperatures in a range of 300 to 500° C. Should the hard-baking be above 500° C., the polysilazane might not be as easily converted into silicon oxide. Additionally, a surface of the polysilazane might convert more rapidly than the remainder, which might then result in cracking or formation of an uneven silicon oxide film.

After the hard-bake, the film may be annealed using a temperature in a range of about 600 to 1200° C. for a duration of about 10 to 120 minutes. Further, the anneal may use an oxidation atmosphere, e.g., such as an oxygen atmosphere, a vapor atmosphere or a mixed atmosphere of both vapor and oxygen.

Polysilazane based SOG comprises Si—N bonds. Ideally, such Si—N bonds are replaced with Si—O bonds when cured in an atmosphere of oxygen and water. In accordance with exemplary embodiments of the present invention, after forming a film from an SOG composition comprising the polysilazane of the above-described exemplary embodiment, the film is then cured to remove the Si—N bonds and undesirable gasses. For such exemplary embodiments, the Si—N bonds of the film are removed and the resultant oxide film may have characteristics substantially identical to a silicon oxide film deposited by chemical vapor deposition (i.e., CVD).

Again, during the anneal, the film in this embodiment is exposed to temperatures in a range of about 600 to 1200° C. for a duration of about 10 to 120 minutes. If annealed at temperatures below 600° C., the SOG film might not be fully cured. Absent a sufficient cure, the film may include un-reacted Si—N bonds that might degrade characteristics of the oxide film. On the other hand, if the anneal is carried out above 1200° C., cracks might be created and its planarization compromised.

In addition, if the anneal were to last an insufficient duration, for example, less than about 10 minutes, the SOG film might again be insufficiently cured; in which portions of the material of the film would not be converted into silicon oxide. At the other end, should the anneal last too long, e.g., more than about 120 minutes, the silicon oxide film might be created with undue stresses.

For exemplary embodiments, the anneal uses an oxidation atmosphere appropriate for converting the Si—N bonds of the film into Si—O bonds. For example, the anneal may use an oxygen atmosphere, a vapor atmosphere or a mixed atmosphere of both vapor and oxygen. In a particular exemplary embodiment, the anneal uses a vapor atmosphere comprising vapor of about 1.2 to 86 weight percent.

According to further exemplary embodiments of the present invention, the silicon oxide film may be formed from an SOG composition with a thickness of about 5000 to 10000 gÅ.

In an exemplary process for manufacturing SOG composition, perhydropolysilazane of an average molecular weight of about 4500 to 7000 and a molecular weight dispersion degree of 3.0 to 4.0, may be obtained by fractionating commercially available perhydropolysilazane. Then, the fractionated perhydropolysilazane may be dissolved in xylene, or other solvent, so as to provide a density thereof of about 22 to 25 weight percent. With such composition, a contact angle of the SOG composition (with respect to an is underlayer, for example, such as a silicon nitride film) may be kept less than about 4 degrees.

Figure 5:
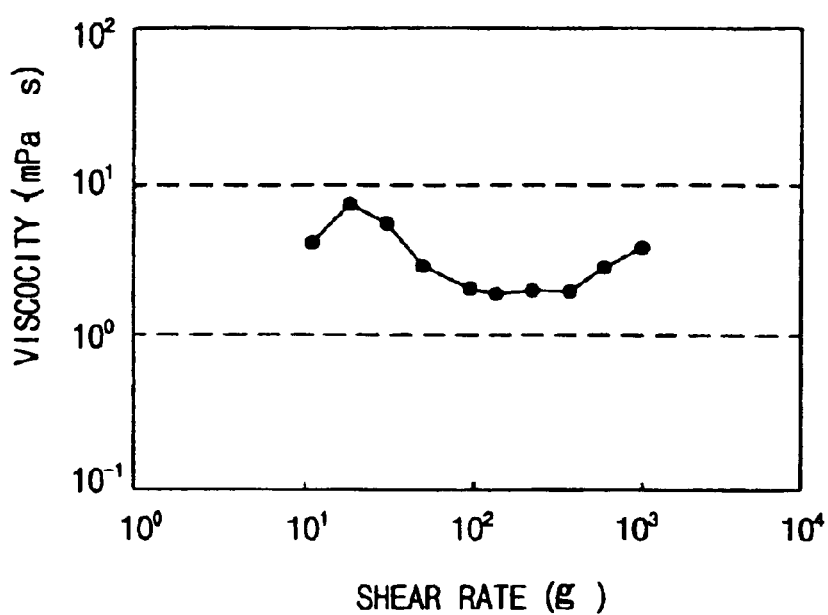
FIG. 5 is a graph showing viscosity characteristics of an SOG composition that may be used in accordance with an exemplary embodiment of the present invention.

A viscosity of a SOG composition is shown in FIG. 5, wherein the viscosity is measured while varying the shear rate. The viscosity of the SOG composition may vary as a function of the shear rate. In the graph, the vertical axis represents the viscosity (mPa.s), and the horizontal axis represents the shear rate (1/s). As can be noted from FIG. 5, the SOG composition comprises a viscosity of 1 to 10 mPa.s at shear rates of 54 to 420 (1/s).

A method of forming an interlayer dielectric film according to an exemplary embodiment of the present invention may be described with reference to FIGS. 6 to 10.

Figure 6:
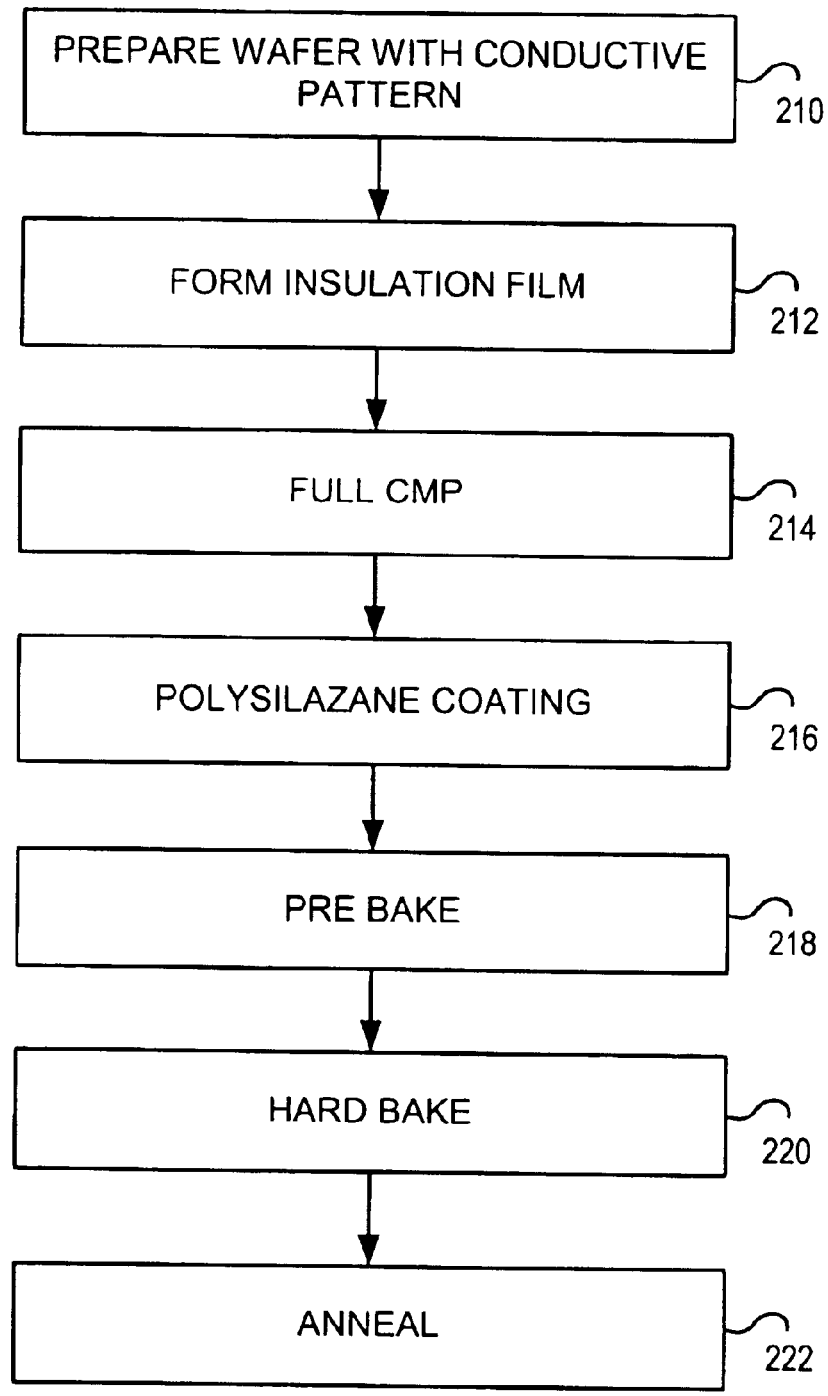
FIG. 6 is a simplified flow chart for a method of forming an interlayer dielectric film in accordance with exemplary embodiments of the present invention.
Figure 7:
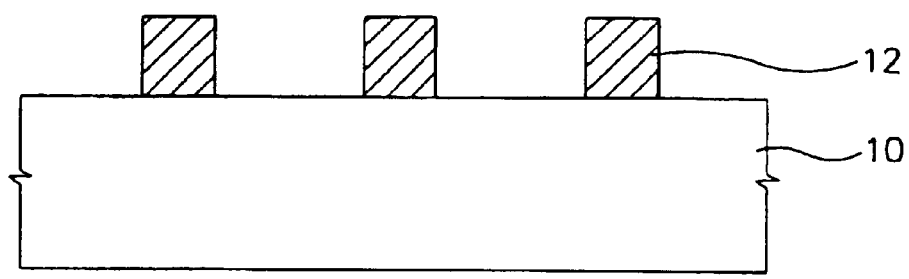
FIGS. 7 to 10 are simplified cross-sectional views of a semiconductor substrate during various stages of a process for forming a dielectric film in accordance with exemplary embodiments of the present invention.
Figure 8:
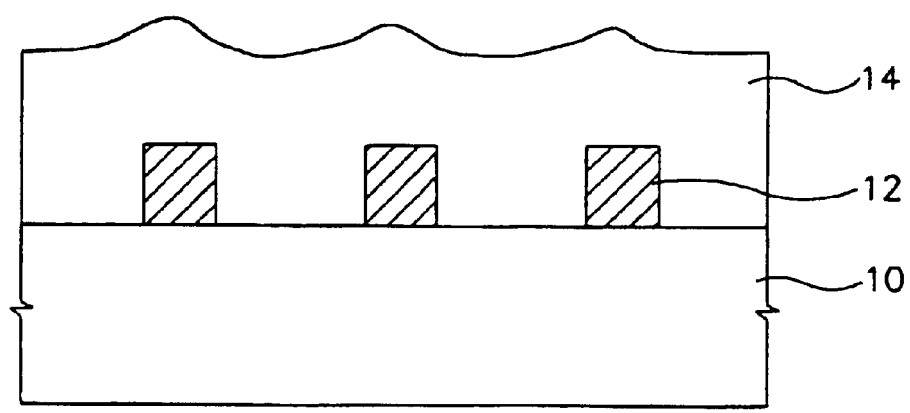

Referring to FIG. 7, a semiconductor substrate 10 is prepared with a metal wiring pattern 12 (step 210 in FIG. 6). Referring to FIG. 8, insulating film 14 is formed over the substrate 10 and over the metal wiring pattern 12. The insulating film 14 may completely cover the metal wiring pattern 12 and may be formed from deposition of BPSG, from a high density plasma (HDP) fabricated oxide or from an oxide film obtained from a polysilazane SOG (step 212 in FIG. 6).

Figure 9:
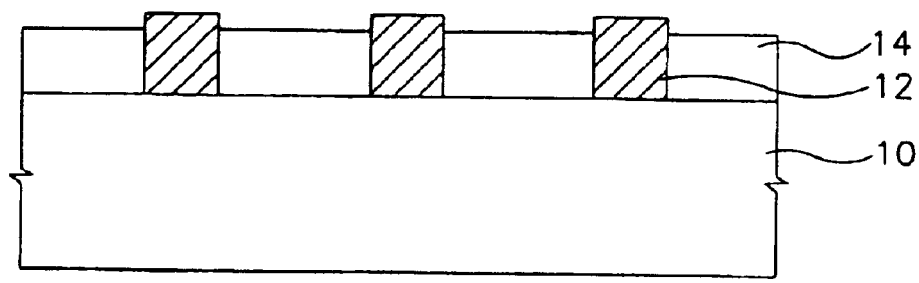

Referring to FIG. 9, insulating film 14 may be polished until an upper portion of the wiring pattern 12 is exposed. The polishing may use a chemical mechanical polishing process, which in turn may use a $SiO_2$, $CeO_2$, $Al_2O_3$ or $Mn_2O_3$ based slurry (step 214 in FIG. 6). Such slurries may have a high etching selectivity for etching the insulating film 14 more favorably relative to the metal or conductive lines 12. Accordingly, the insulating film 14 may be over-polished by the CMP process so at to expose an upper portion of metal wiring pattern 12. Accordingly, a step (or difference in elevation) is created between the upper surface of polished insulating film relative to the upper surface of metal lines 12.

Figure 10:
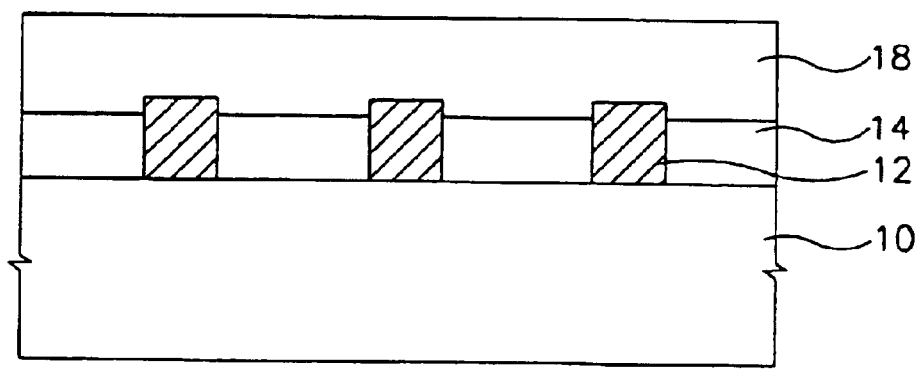

Referring to FIG. 10, a coating of the spin on glass composition—that includes polysilazane as disclosed previously herein in accordance with exemplary embodiments of the present invention—is spun over the substrate to form film 18 (or film coating 18) on the polished insulating material 14 and over the upper portions of lines 12 (step 216 in FIG. 6).

Next, film 18 may be pre-baked in a temperature range of about 50 to 350° C. for a duration of about 1 to 5 minutes (step 218 in FIG. 6). Again, as mentioned previously herein, the pre-bake may use multi-level stages, e.g., of increasing temperature with each sequential stage.

After the pre-bake, a hard-baking step is carried out for about 10 to 120 minutes in an H20 atmosphere. The hard-bake may use temperatures in a range of 300 to 500° C. (step 220 in FIG. 6). During hard-baking, $SiH_4$ gas may be discharged from film 18.

After the hard-bake, the film is annealed to complete conversion of the film 18 into an oxide (step 222 in FIG. 6). The anneal may use temperatures in a range of about 600 to 1200° C. and may last for a duration of about 10 to 120 minutes. Additionally, the anneal may use an oxidation atmosphere such as an oxygen atmosphere, a vapor atmosphere or a mixed atmosphere of both vapor and oxygen.

In this exemplary embodiment, the Si—N bonds are replaced with Si—O bonds for obtaining a silicon oxide film. Additionally, by such exemplary embodiment, the oxide film may be formed with a planarized surface. Further, since $SiH_4$ gas has already been removed during the hard-baking, the generation of contaminants may be prevented during the anneal. Accordingly, damage that might otherwise result from the contaminants may be avoided during the anneal.

In further exemplary embodiments, the thickness of the oxide film may be kept below a maximum crack free thickness. If the film is formed with a thickness below this thickness, crack formations may be prevented within the silicon oxide film.

Figure 11:
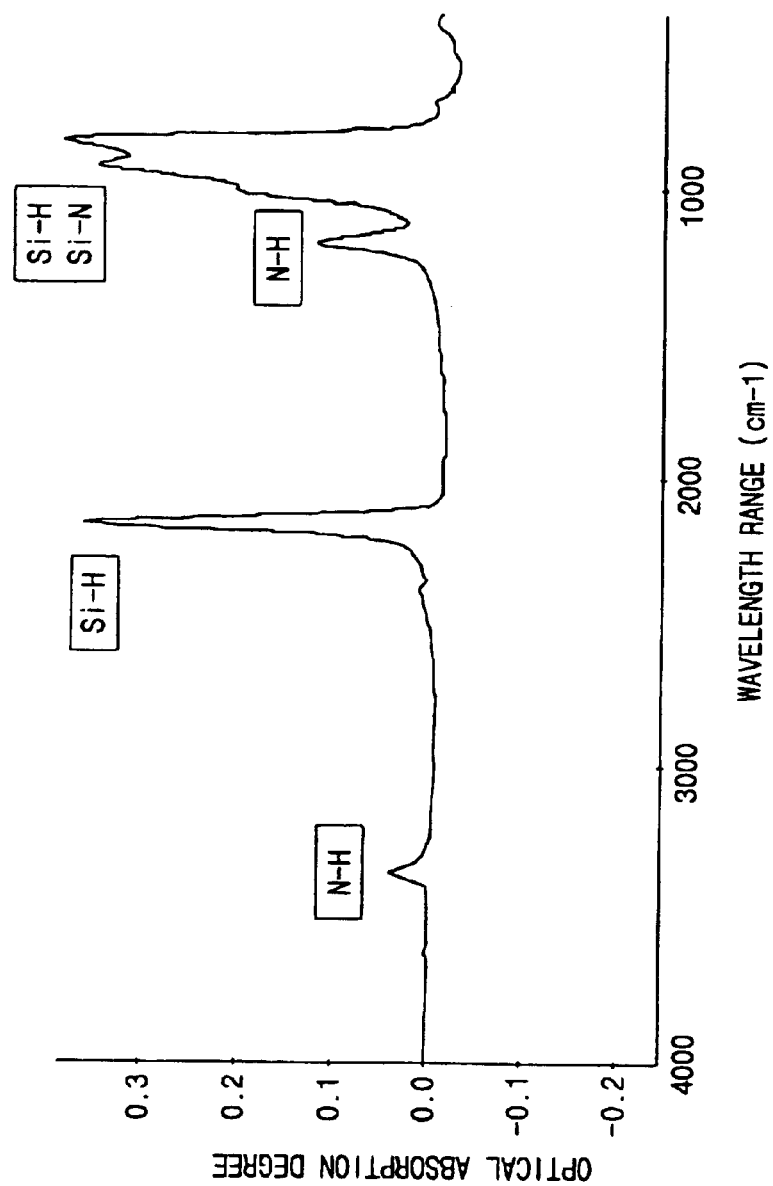
FIG. 11 is an FT-IR chart showing an optical absorption degree of an SOG film as may be provided therefore after pre-baking the film in accordance with an exemplary embodiment of the present invention.

FIG. 11 is an FT-IR graph showing degrees of optical absorption of a SOG film measured after pre-baking. Absorption peaks may be seen representative of the N—H, Si—H, Si—N and Si—H bonds across the wavelength range. Additionally, for an exemplary embodiment, a stress value (as measured by a stress gauge) was determined to be $3.63 \times 10^8$ (dyne/cm$^2$). From this optical absorption evaluation, it may be seen that large SI—H components may remain in the film. For this reason, according to exemplary embodiments of the present invention, hard-baking is provided to remove such Si—H components from the film. By removing such Si—H components with the hard-bake, the residues may be prevented from generation during a subsequent anneal.

Figure 12:
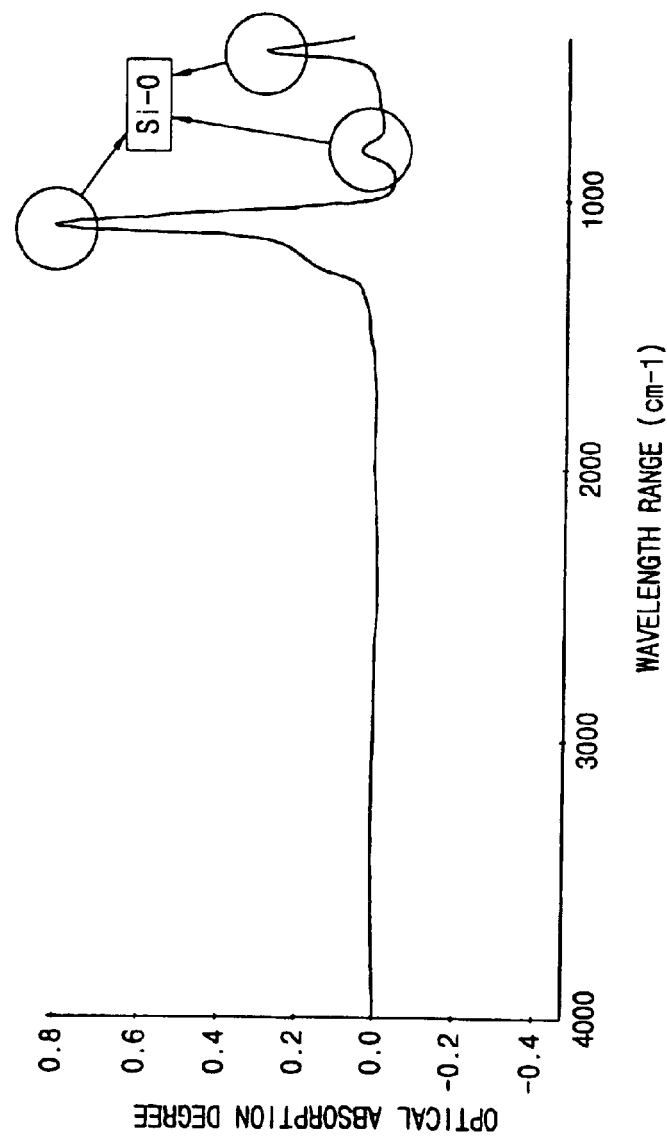
FIG. 12 is an FT-IR chart showing an optical absorption degree of an SOG film as might be provided therefore after annealing the film in accordance with an exemplary embodiment of the present invention.

FIG. 12 is an FT-IR graph showing optical absorptions of the SOG film measured after annealing the SOG film. As is understood from FIG. 12, the absorption peaks comprise primarily those of Si—O bonds. At this time, a stress value for an exemplary embodiment (measured by a stress gauge) was determined to be $-1.22 \times 10^8$ (dyne/cm$^2$). It is understood, from FIG. 12, that primarily all Si—N bonds have been replaced with Si—O bonds so that completion of the silicon oxide film might be obtained.

In accordance with further exemplary embodiments of the present invention, wet etching of a polysilazane film may be provided following the hard baking. Table 1 shows a wet etching rate (Å/min) of a polysilazane silicon oxide film, in accordance with an exemplary embodiment of the present invention, which may be compared with the wet etching rate of other oxide films.

TABLE 1

|  | LAL 500 | LAL 200 | 100:1 HF | Hightemp. SC1 | Lowtemp. SC1 | Boiling sulfuric acid | NOR |
| --- | --- | --- | --- | --- | --- | --- | --- |
| HDP Oxide | 900 | — | 50 | 3 | 1 | 1 | 30 |
| Polysilazane oxide film | 1100 | 520 | 70 | 5 | 1 | 1 | 30 |
| FOx Oxide film | — | 1080 | 130 | 8 | 2 | 2 | 310 |

As shown in table 1, the polysilazane silicon oxide film (the silicon oxide film made from the SOG that includes the polysilazane) per exemplary embodiments of the present invention may have an etching rate substantially identical to etching rates of other oxide films. Such characteristics may be observed, even though the polysilazane silicon oxide film per the exemplary embodiments of the present invention may have been processed by the hard-baking. Accordingly, with its similar features capable of being preserved, the polysilazane derived SOG film of the exemplary embodiments of the present invention may be well suited for incorporation with other oxide films as may be used during further processing of semiconductors.

In the exemplary embodiment of the present invention, the film may be described to cover and fill gaps of a wiring pattern over a semiconductor substrate. However, the film manufacture might not be limited to such particular exemplary application. For example, the polysilazane derived SOG film, per the previously described exemplary embodiments of the present invention, might also be used as a fill material for a trench in a trench type isolating layer, or as an insulating layer of a word line and a bit line.

As described above, according to exemplary embodiments of the present invention, the polysilazane silicon oxide film may be used for capping a wiring pattern that may be exposed by a full CMP process. Hard-baking of such film may reduce particles that might otherwise form during an anneal. Therefore, $SiH_4$ gas of the film may be purged from the film before such anneal. By performing the anneal after such hard-baking and outgassing of, e.g., the $SiH_4$ gas, the generation of contaminating particles may be prevented during the anneal. Additionally, the polysilazane silicon oxide film may be formed with reduced risk of cracking.

Finally, a thickness of the film may be adjusted to a thickness below the maximum crack free thickness by using, for example, a CMP process or an etch back process. Such thickness reduction may further serve to prevent the polysilazane silicon oxide film from cracking. Accordingly, a reliability of the semiconductor device may be improved.

While the present invention has been described in detail with reference to exemplary embodiments described above, it may be understood to those skilled in the art that various changes, substitutions and alteration can be made thereto without departing from the scope of the invention as defined by the appended claims.

What is claimed is:

1. A method of forming an interlayer, the method comprising:
    preparing a substrate with a wiring pattern;
    forming an insulating film on the substrate;
    chemical mechanical polishing the insulating film and exposing an upper portion of the wiring pattern;
    coating the polished insulation and exposed portion of the wiring pattern with spin on glass composition to form a film;
    the coating using polysilazane in the spin on glass composition;
    pre-baking the film in a temperature range of 50 to 350° C.;
    after the pre-baking, hard-baking the film in a temperature range of 300 to 500° C.; and
    heat-treating the film in an oxidation atmosphere.

2. The method as claimed in claim 1, wherein the forming the insulating film comprises forming at least one of a BPSG film, a HDP oxide film and an SOG oxide layer from a spin on glass composition having polysilazane.

3. The method as claimed in claim 2, further comprising using at least one of a $SiO_2$, $CeO_2$, $Al_2O_3$ or $Mn_2O_3$ based slurry in the chemical mechanical polishing.

4. The method as claimed in claim 1, wherein the coating uses a spin on glass composition comprising about 3 to 15 weight percent of perhydropolysilazane having a structure of —$(SiH_2NH)_n$ (n being a positive number), an average molecular weight of about 4000 to 8000 and a molecular weight dispersion degree of about 3.0 to 4.0.

5. The method of claim 4, in which the coating further comprises using about 97 to 85 weight percent solvent in the spin on glass composition.

6. The method as claimed in claim 4, wherein the coating uses a spin on glass composition that comprises a viscosity of about 1 to 10 mPa s and shear rate of 54 to 420 (1/s).

7. The method as claimed in claim 4, in which the coating establishes the spin on glass composition with a contact angle less than 4 degrees with respect to an underlayer.

8. The method as claimed in claim 4, wherein the coating further comprises using a spin-on-glass composition that comprises at least one of the impurities from the group consisting of B, F, P, B and C.

9. The method as claimed in claim 4, wherein the coating further comprises using a spin-on-glass composition that comprises a compound having at least one of the elements from the group consisting of B, F, P, B, C and O.

10. The method as claimed in claim 4, wherein the solvent of the spin-on-glass composition comprises at least one of xylene or dibutylether.

11. The method as claimed in claim 1, wherein the heat-treating comprises establishing a temperature in a range of about 600 to 1200° C.

12. The method as claimed in claim 11, wherein the heat-treating lasts for a duration of about 10 to 120 minutes and uses an oxidation atmosphere selected from the group consisting of an oxygen atmosphere, a vapor atmosphere and a mixed atmosphere of vapor and oxygen.

13. The method as claimed in claim 1, wherein the film is formed with a thickness of about 500 to 10000 Å.

14. The method as claimed in claim 1, wherein the hard-baking exposes the film to an oxidation atmosphere selected from the group consisting of an oxygen atmosphere, a vapor atmosphere and a mixed atmosphere of vapor and oxygen for a duration of about 10 to 120 minutes.

15. The method as claimed in claim 1, wherein the hard-baking exposes the film to an inert atmosphere for a duration of about 10 to 120 minutes.

16. The method as claimed in claim 15, in which the hard-baking comprises baking the substrate in a vacuum for a duration of about 10 to 120 minutes.

17. The method as claimed in claim 15, in which the hard-baking further comprises establishing a vacuum for the inert atmosphere.

18. The method as claimed in claim 1, further comprising:
determining an upper limit for the thickness of the film of spin on glass by which it may be hard-backed without crack formation;
determining if a thickness of the film exceeds the upper limit; and
decreasing a thickness of the film to below the upper limit dependent upon the thickness determination.

19. The method as claimed in claim 18, wherein the decreasing the thickness of the film uses at least one of a chemical mechanical polishing or an etch back process.

20. A method of forming an interlayer dielectric, comprising:
forming insulating material on a semiconductor substrate;
polishing the insulating material using a chemical mechanical polishing process and exposing an upper portion of a conductive pattern of the semiconductor substrate;
coating the polished insulating material and the upper portion of the conductive pattern with a spin on glass composition and forming a film, the coating using polysilazane in the spin on glass composition;
pre-baking the film at a temperature below 500° C.;
determining if a thickness of the film exceeds a crack free thickness limit;
decreasing a thickness of the film dependent on the determining; and
heat-treating the film in an oxidation atmosphere.

21. A method of processing a semiconductor substrate, comprising:
forming insulating material on a semiconductor substrate having a conductive pattern and step;
chemical mechanical polishing the insulating material and exposing an upper portion of the conductive pattern;
coating the insulating material and the exposed upper portion of the conductive pattern with spin on glass composition to form a film;
using polysilazane in the spin on glass composition;
pre-baking the film in a predetermined first temperature range for a first duration;
hard-baking the film in a predetermined second temperature range for a second duration, the predetermined second temperature range higher than the first; and
heat-treating the film for a third duration in an oxidation atmosphere of a predetermined third temperature range, the predetermined third temperature range higher than the second.

22. A method of forming an interlayer dielectric film, the method comprising:
coating a spin on glass composition on a first insulation film that is formed on semiconductor substrate having a conductive pattern, the conductive pattern being exposed through the first insulation film, the coating using polysilazane in the spin on glass composition;
curing the spin on glass composition to form a second insulation film;
outgassing the second insulation film, the outgassing comprising releasing silane gas; and
annealing and oxidizing the second insulation film.

23. The method as claimed in claim 22, in which the coating uses a spin on glass composition comprising about 20 to 30 weight percent of perhydropolysilazane and about 80 to 70 weight percent of a solvent, the perhydropolysilazane having a structure of —$(SiH_2NH)_n$ (n being a positive number), an average molecular weight of about 4000 to 8000 and a molecular weight dispersion degree of about 3.0 to 4.0.

24. The method as claimed in claim 23, in which the spin on glass composition further comprises a constant viscosity of about 1 to 10 (mPa s) at a shear rate of about 54 to 420 (1/s).

25. The method as claimed in claim 23, in which the coating establishes the spin on glass composition with a contact angle less than about 4 degrees with respect to an underlayer.

26. The method as claimed in claim 23, wherein the spin on glass composition comprises at least one impurity compound comprising at least one element of the group consisting of B, F, P, B, C and O.

27. The method as claimed in claim 23, wherein the solvent comprises at least one of xylene or dibutylether.

28. The method as claimed in claim 22, wherein the annealing uses temperatures in a range of about 600 to 1200° C.

29. The method as claimed in claim 28, in which the annealing comprises exposing the film to an oxidation atmosphere comprising at least one of oxygen and vapor for a duration of 10 to 120 minutes.

30. The method as claimed in claim 22, in which the curing comprises pre-baking the semiconductor substrate through multiple stages of different temperatures.

31. A method according to claim 30, in which the pre-baking uses a temperature range of S0 to 350° C. for the multiple stages.

32. The method as claimed in claim 30, wherein the outgassing comprises hard-baking the film in a temperature range of about 300 to 500° C.

33. The method as claimed in claim 32, wherein the hard-baking comprises exposing the film to an atmosphere that comprises at least one of vapor and oxygen for a duration of about 10 to 120 minutes.

34. The method as claimed in claim 32, wherein the hard-baking is carried out for a duration of about 10 to 120 minutes in an inert atmosphere.

35. A method according to claim 34, in which the hard-baking uses nitrogen in the inert atmosphere.

36. A method according to claim 35, in which the hard-baking further comprises removing gases from a chamber to establish a vacuum for the inert atmosphere.

* * * * *

UNITED STATES PATENT AND TRADEMARK OFFICE
CERTIFICATE OF CORRECTION

PATENT NO. : 6,762,126 B2
DATED : July 13, 2004
INVENTOR(S) : Cho et al.

It is certified that error appears in the above-identified patent and that said Letters Patent is hereby corrected as shown below:

Column 7,
Line 19, "10000 gÅ." should read -- 10000 Å. --.
Line 30, "to an is underlayer, for" should read -- to an underlayer, for --.

Column 12,
Line 46, "range of S0 to 350°C." should read -- range of 50 to 350°C. --.

Signed and Sealed this

Twenty-fourth Day of May, 2005

JON W. DUDAS
*Director of the United States Patent and Trademark Office*